United States Patent
Lung et al.

(10) Patent No.: US 6,285,586 B1
(45) Date of Patent: Sep. 4, 2001

(54) NONVOLATILE STATIC RANDOM ACCESS MEMORY

(75) Inventors: Hsiang-Lan Lung, Hsinchu; Shue-Shuen Chen, Yunlin; Tung-Cheng Kuo, Yilan, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/688,767

(22) Filed: Oct. 16, 2000

(51) Int. Cl.$^7$ ................................................ G11C 16/04
(52) U.S. Cl. ................................................ 365/185.08
(58) Field of Search .................... 365/185.08, 185.26, 365/185.14, 154

(56) References Cited

U.S. PATENT DOCUMENTS

| | | | |
|---|---|---|---|
| 4,207,615 | * 6/1980 | Mar ........................................... | 365/95 |
| 4,460,978 | * 7/1984 | Jiang et al. ............................. | 365/154 |
| 4,527,255 | * 7/1985 | Keshtbod ................................. | 365/154 |
| 5,488,579 | * 1/1996 | Sharma et al. .......................... | 365/185 |
| 5,828,599 | * 10/1998 | Herdt ....................................... | 365/185.08 |
| 5,986,932 | * 11/1999 | Ratnakumar et al. ................. | 365/185.07 |

* cited by examiner

Primary Examiner—Richard Elms
Assistant Examiner—Anh Phung

(57) ABSTRACT

A nonvolatile static random access memory adapted for a semiconductor substrate mainly comprises a nonvolatile erasable programmable memory transistor having a charge storage layer for storing data charges, and further having a first gate terminal, a first source terminal, and a first drain terminal, wherein the first gate terminal is connected to a word line, the first source terminal is connected to a power supply circuit through a first loader, and the first drain is connected to a first bit line; an access transistor having a second gate terminal, a second source terminal, and a second drain terminal, wherein the second gate terminal is connected to the word line, the second source terminal is connected to the power supply circuit through a second loader, and the second drain is connected to a second bit line; a first drive transistor having a third gate terminal, a third source terminal, and a third drain terminal, wherein the third gate terminal is connected to the second source terminal, the third source terminal is connected to ground, and the third drain terminal is connected to the first source terminal; a second drive transistor having a fourth gate terminal, a fourth source terminal, and a fourth drain terminal, wherein the fourth gate terminal is connected to the first source terminal, the fourth source terminal is connected to ground, and the fourth drain terminal is connected to the second source terminal; and a read control transistor having a fifth gate terminal, a fifth source terminal, and a fifth drain terminal, wherein the fifth gate terminal is connected to a control line, the fifth source terminal is connected to ground, and the fifth drain terminal is connected to the first bit line.

26 Claims, 4 Drawing Sheets

NONVOLATILE STATIC RANDOM ACCESS MEMORY

FIELD OF THE INVENTION

The present invention relates to a nonvolatile semiconductor memory, and more particularly to a Nonvolatile Static Random Access Memory (NVSRAM).

BACKGROUND OF THE INVENTION

There are essentially two types of data memory devices used in computers today, "Nonvolatile" and "Volatile". Common nonvolatile memory devices include well-known Read Only Memory (ROM) devices that include EPROM (erasable programmable ROM) devices, EEPROM (electrically erasable programmable ROM) devices, and Flash EEPROM devices. These nonvolatile memory devices maintain the data stored therein, even when power to the device is removed, thus they are nonvolatile. Volatile memory devices include Dynamic Random Access Memory (DRAM) and Static Random Access Memory (SRAM) devices. RAM devices in the prior art have been used for temporary data storage, such as during data manipulation, since writing data into, and reading data out of, the device is performed quickly and easily. However, a disadvantage of these devices is that they require the constant application of power, such as in the form of a data refresh signal, to refresh and maintain data stored in the memory cells of the chip. Once power supplied to the device is interrupted, the data stored in the memory cells of the chip is lost.

Flash EEPROMs are most commonly used in all of the nonvolatile memory devices. The Flash EEPROM has an advantage of being nonvolatile, but the flash EEPROM has a problem of endurance. Under repeated cycling program/erase operations, the flash EEPROM is exhausted and results in breaking down, so that the flash EEPROM loses the capability of data storage. In addition, the flash EEPROM relative to DRAM and SRAM needs higher threshold voltage and longer time for programming. Therefore, the speed of the computer will be very slow if the flash EEPROM in used as a memory device.

SRAM having fast data access speed and long lifetime in all of the memory devices is suitable for use in the computer, such as in BIOS. However, the SRAM is a volatile memory device. The data stored in the SRAM will be lost if power is interrupted. Hence, an additional nonvolatile memory device is needed, such as a hard disk, to store data before the power is turned off.

If the SRAM and nonvolatile memory device can be combined, the memory device will have both advantages of the SRAM and the nonvolatile memory device, such as fast data access, long lifetime, and data retention, so that a nonvolatile SRAM will be useful and worthy.

SUMMARY OF THE INVENTION

The present invention provides a nonvolatile static random access memory (NVSRAM) constructed by replacing a transistor in the conventional SRAM cell with a nonvolatile erasable programmable memory transistor (NEPMT), and accompanied by a suitable circuit device. The NVSRAM has the advantages of the SRAM and the nonvolatile memory device, such as fast data access, long lifetime, and nonvolatility.

The present invention provides a nonvolatile static random access memory device adapted for a semiconductor substrate, comprising: A nonvolatile erasable programmable memory transistor having a charge storage layer for storing data charges, and having a first gate terminal, a first source terminal, and a first drain terminal, wherein the first gate terminal is connected to a word line, the first source terminal is connected to a power supply circuit through a first loader, and the first drain is connected to a first bit line; an access transistor having a second gate terminal, a second source terminal, and a second drain terminal, wherein the second gate terminal is connected to the word line, the second source terminal is connected to the power supply circuit through a second loader, and the second drain is connected to a second bit line; a first drive transistor having a third gate terminal, a third source terminal, and a third drain terminal, wherein the third gate terminal is connected to the second source terminal, the third source terminal is connected to ground, and the third drain terminal is connected to the first source terminal; a second drive transistor having a fourth gate terminal, a fourth source terminal, and a fourth drain terminal, wherein the fourth gate terminal is connected to the first source terminal, the fourth source terminal is connected to ground, and the fourth drain terminal is connected to the second source terminal; and a read control transistor having a fifth gate terminal, a fifth source terminal, and a fifth drain terminal, wherein the fifth gate terminal is connected to a control line, the fifth source terminal is connected to ground, and the fifth drain terminal is connected to the first bit line.

The present invention also provides a method for operating the above-discussed nonvolatile static random access memory (NVSRAM) device, comprising the steps of:

(1) after the power is turned on, the data stored in the charge storage layer of the nonvolatile erasable programmable memory transistor is read out in a nonvolatile operation mode and is transmitted to a data buffer region, and then the data in the data buffer region is transmitted and stored in the NVSRAM cell in a SRAM operation mode;

(2) after the data is converted, the NVSRAM cell is operated in the SRAM operation mode; and (3) before power is turned off, the data stored in the NVSRAM cell is read out in the SRAM mode and is transmitted to the data buffer region, and then, the data in the data buffer region is stored in the charge storage layer in a nonvolatile operation mode.

BRIEF DESCRIPTIONS OF THE DRAWINGS

DETAILED DESCRIPTIONS OF THE INVENTION

The present invention discloses a nonvolatile static random access memory (NVSRAM) and an operation method thereof. The NVSRAM has both advantages of the SRAM and a nonvolatile memory device. The NVSRAM, operated in SRAM mode under normal operating while power is on, can provide fast access of data and with no endurance problem. Before power is turned off and after power is turned on, the NVSRAM is operated in nonvolatile mode to write in and read out, so that the data can be stored in the nonvolatile erasable programmable memory (NEPM) transistor, and hence the NVSRAM is nonvolatile.

Figure 1:
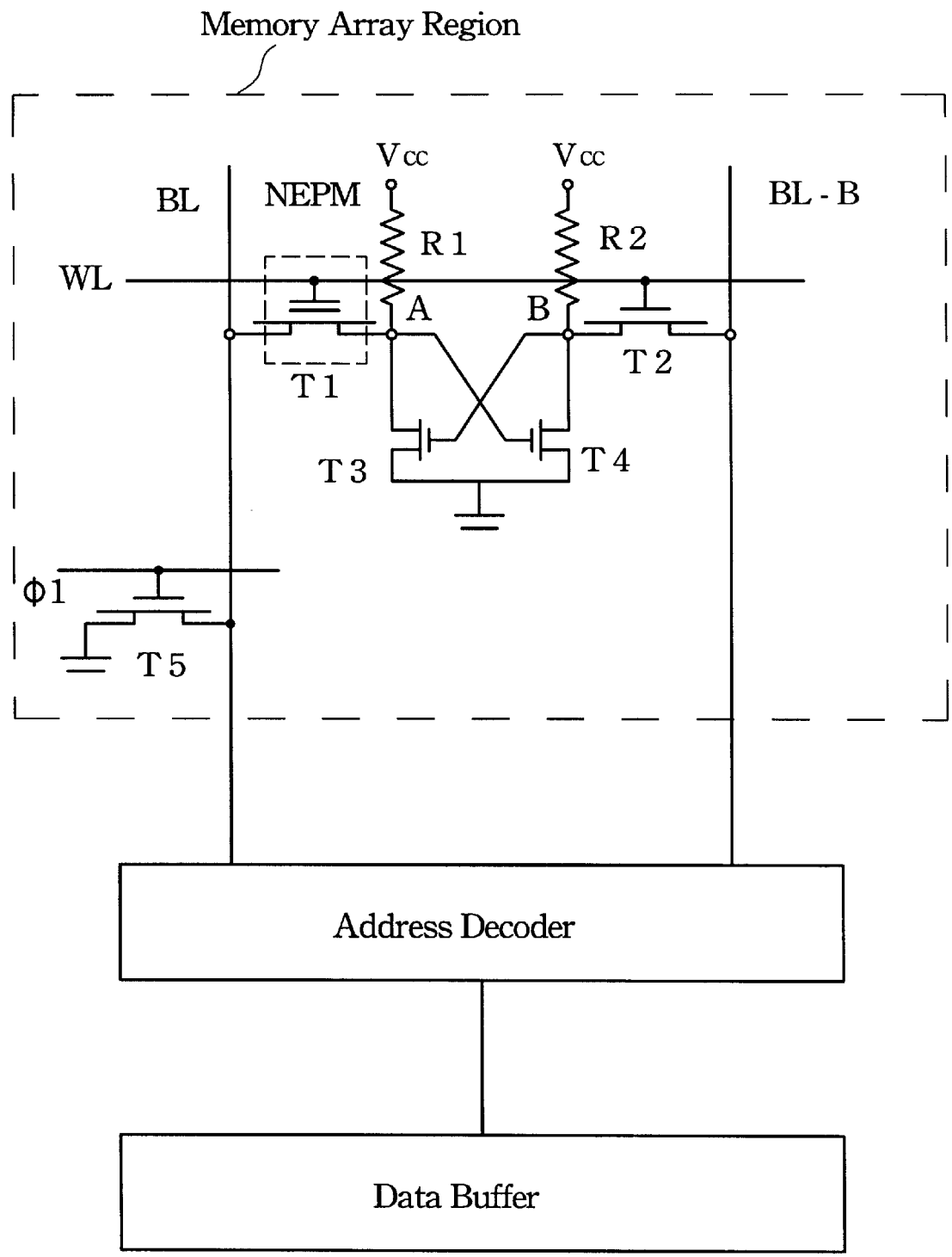
FIG. 1 shows a schematic view of the circuit of the nonvolatile static random access memory (NVSRAM) device according to the present invention.

The circuit of the NVSRAM according to the present invention is described first. A four transistor-2 resistor structure is used in the preferred embodiment of the invention. Referring to FIG. 1, a schematic view of the circuit of the present invention is illustrated. The NVSRAM cell is similar to the conventional static random access memory (SRAM) cell, and is mainly comprised of four transistors (T1, T2, T3, T4) and two resistors (R1, R2). The transistors T2, T3, and T4 are conventional field effect transistors (FETs), and the resistors R1 and R2, for example, are silicon resistors.

The transistor T1 of the NVSRAM of the present invention is a nonvolatile erasable programmable memory (NEPM) transistor. It comprises the conventional flash EEPROM cell, such as a floating gate transistor having a metal-insulator-metal-insulator-semiconductor (MIMIS) structure, or a metal-nitride-oxide-semiconductor (MNOS) transistor, a silicon-nitride-oxide-semiconductor (SNOS) transistor, and a silicon-oxide-nitride-oxide-semiconductor (SONOS) transistor, etc. The transistor T1 has the function of the nonvolatile memory cell and the FET. It can store a data charge in the charge storage layer, such as a silicon nitride layer or a polysilicon layer, for a long time. In order to further understand about the NEPM transistor, a SONOS transistor is used in the embodiment to described more in detail.

Figure 2:
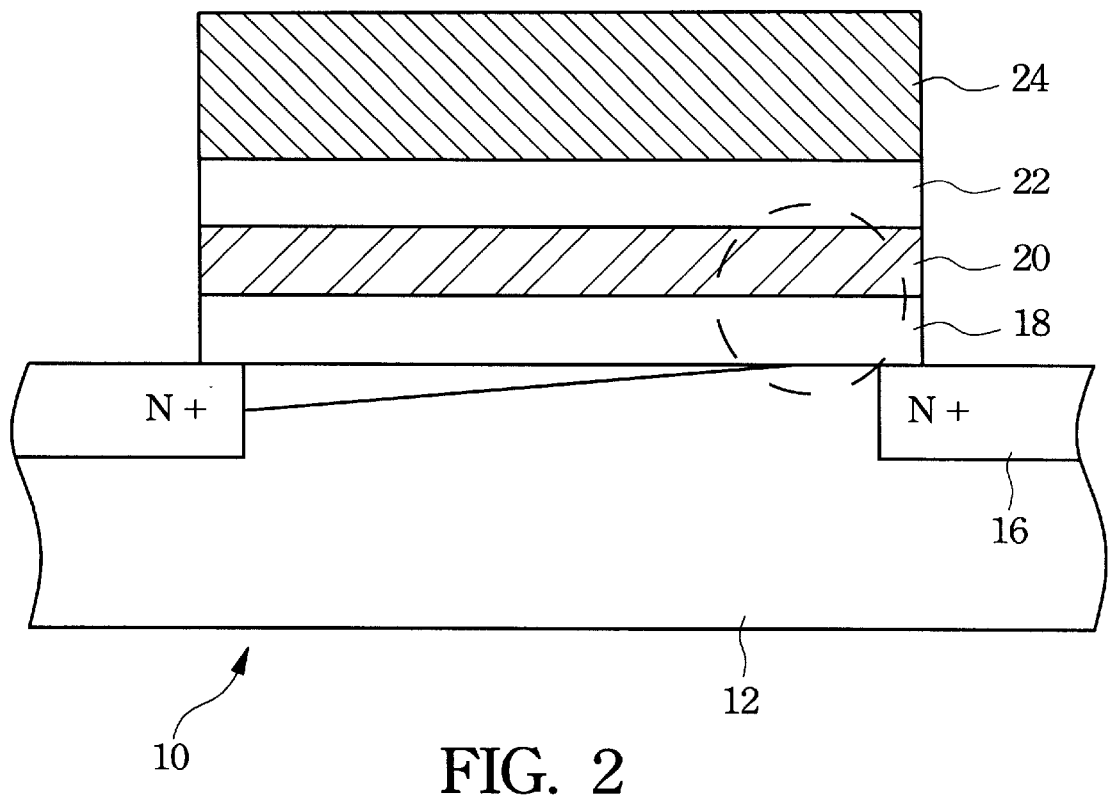
FIG. 2 shows a cross-sectional view of the transistor T1 in FIG. 1 using a nonvolatile erasable programmable memory transistor having SONOS structure.

Referring to FIG. 2, a cross-sectional view of the SONOS transistor is illustrated. The SONOS transistor 10 constructed on a semiconductor substrate 12 is comprised of a source region 14, a drain region 16, and a stacked gate layer on the channel between the source and drain region 14 and 16. The stacked gate layer is stacked with a silicon oxide layer 18, a silicon nitride layer 20, a silicon oxide layer 22, and a polysilicon layer 24. The polysilicon layer 24 serves as a control gate. The silicon nitride layer 20 serves as a charge storage layer to store a data charge between the silicon nitride layer 20 and the silicon oxide layer 18, as shown in the circle of FIG. 2. The fabricating process of the SONOS transistor 10 is well known in the art and will not be discussed further. The SONOS transistor relative to a conventional FET just adds a silicon nitride layer and a silicon oxide, so that there is no need of additional area of the device while replacing a FET with the SONOS transistor, and the process integration is very easy without increased manufacturing cost.

Still referring to FIG. 1, the circuit of the NVSRAM of the invention will be further described in detail. The circuit of the NVSRAM cell of the invention is shown in the upper portion of the memory array region. The transistor T1 is a nonvolatile erasable programmable memory (NEPM) transistor. It has a first gate terminal, a first source terminal, and a first drain terminal. The first gate terminal is connected to a word line WL. The first source terminal is connected to a power supply circuit through a first loader R1. The power supply circuit applies a positive voltage Vcc to the first source terminal. The drain terminal is connected to a first bit line BL. The transistors T2, T3, and T4 are connected similarly to the transistors in the conventional SRAM. The transistor T2 having a second gate terminal, a second source terminal, and a drain terminal is an access transistor. The second gate terminal is connected to the word line. The second source is connected to the power supply circuit through a second loader R2. The power supply circuit also applies a positive voltage to the second source terminal. The second drain terminal is connected to a second bit line BL-B. The transistors T3 and T4 are drive transistors. The transistor T3 has a third gate terminal, a third source terminal, and a third drain terminal. The third gate terminal is coupled to the second source terminal and the second loader in point B. The third source terminal is connected to ground. The third drain terminal is coupled to the first source terminal and first loader R1 in point A. The transistor T4 has a fourth gate terminal, a fourth source terminal, and a fourth drain terminal. The fourth gate terminal is coupled to the first loader in point A. The fourth source terminal is connected to ground. The fourth drain terminal is coupled to the second source terminal and second loader R2 in point B. The four transistors T1, T2, T3, and T4, and the two resistors R1 and R2 constitute the NVSRAM cell of the present invention. The structure of the NVSRAM of the invention also can be applied to a memory cell with a 6-transistor (6T) structure or a CMOS structure, wherein the first and second loader R1 and R2 can be replaced with a depletion NMOS transistor or a PMOS transistor, respectively.

In addition, in the end terminal of each first bit line BL is disposed a read control transistor T5 to read the data stored in the NEPM transistor T1 in nonvolatile operation mode. The transistor T5 has a fifth gate terminal, a fifth source terminal, and a fifth drain terminal. The fifth gate terminal is connected to a control line $\Phi 1$. The fifth source terminal is connected to ground. The fifth drain terminal is connected to the first bit line BL.

A NVSRAM array of the present invention is composed by arranging a plurality of the above said NVSRAM cells to the array and by disposing read control transistors T5 in the end terminal of each bit line BL. Furthermore, other periphery circuits, such as an Address decoder, a Data buffer region, and an I/O, are incorporated into the memory array to constitute the NVSRAM of the invention.

The operation method of the NVSRAM of the invention is then described. The NVSRAM of the invention has two operation modes. One is a conventional SRAM operation mode, and the other is nonvolatile operation mode. While the power is on, data is accessed to the NVSRAM in the SRAM mode under normal operations. The NVSRAM now has the advantage of a conventional SRAM, such as fast data access with no endurance problem. The transistor T1 herein is like the transistor T2 serves as an access transistor.

Figure 3:
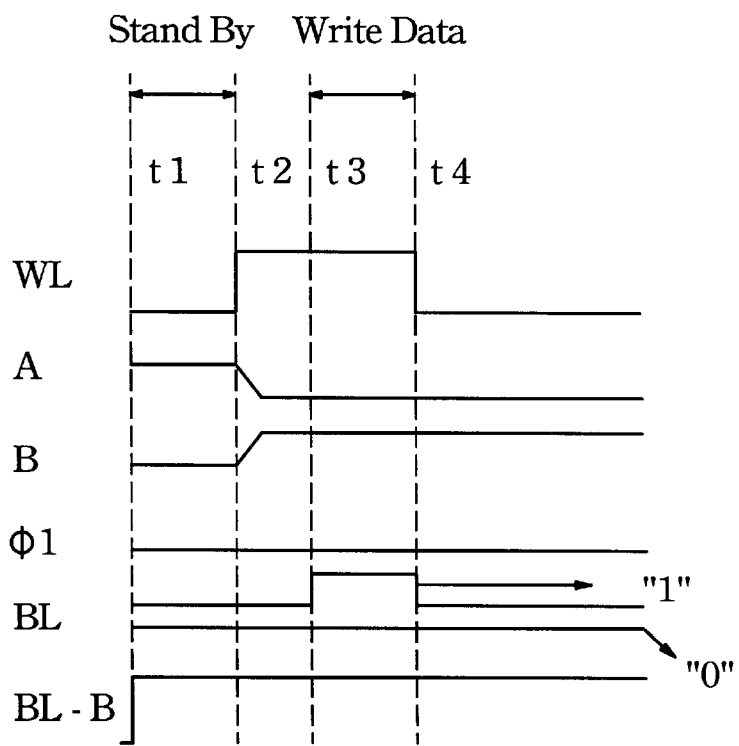
FIG. 3 illustrates a function clock of the NVSRAM of the present invention in nonvolatile operation mode while writing data "0" and "1"

When power is going to be turned off, the data stored in the NVSRAM is read out in SRAM mode and is transmitted to the Data buffer region, and then the data in the Data buffer region is transmitted and stored in the charge storage layer of the NEPM transistor T1 in a nonvolatile mode. The method of nonvolatile operation mode is described below. FIG. 3 illustrates a function clock of the NVSRAM of the present invention while writing data "0" or "1". Referring to FIG. 1 and FIG. 3 at the same time, at time t1, NVSRAM is at its stand-by state, the word line WL, control line $\Phi 1$, and first bit line BL is low, and the second bit line BL-B is high. At time t2, the word line WL is shifted to high, so the transistors T1 and T2 are turned on, and therefore the NEPM transistor T1 can be erased and programmed. Since the second bit line BL-B is high, the transistor T3 is turned on, and results in point A being connected to ground. When the writing data is "0", the first bit line BL is held in low, and no charge is forced to shoot into the charge storage layer, so that the storage data is "0". When the writing data is "1", at times t3 to t4, the first bit line BL is forced to high and point A is connected to ground by the transistor T3, so that there are large drain current flow through T1 and hence charges will be shot into the charge storage layer to be stored in the drain side. Therefore, the NVSRAM of the invention is nonvolatile, and the data is maintained in the charge storage layer of the NEPM transistor and will not vanish when power is turned off.

Figure 4:
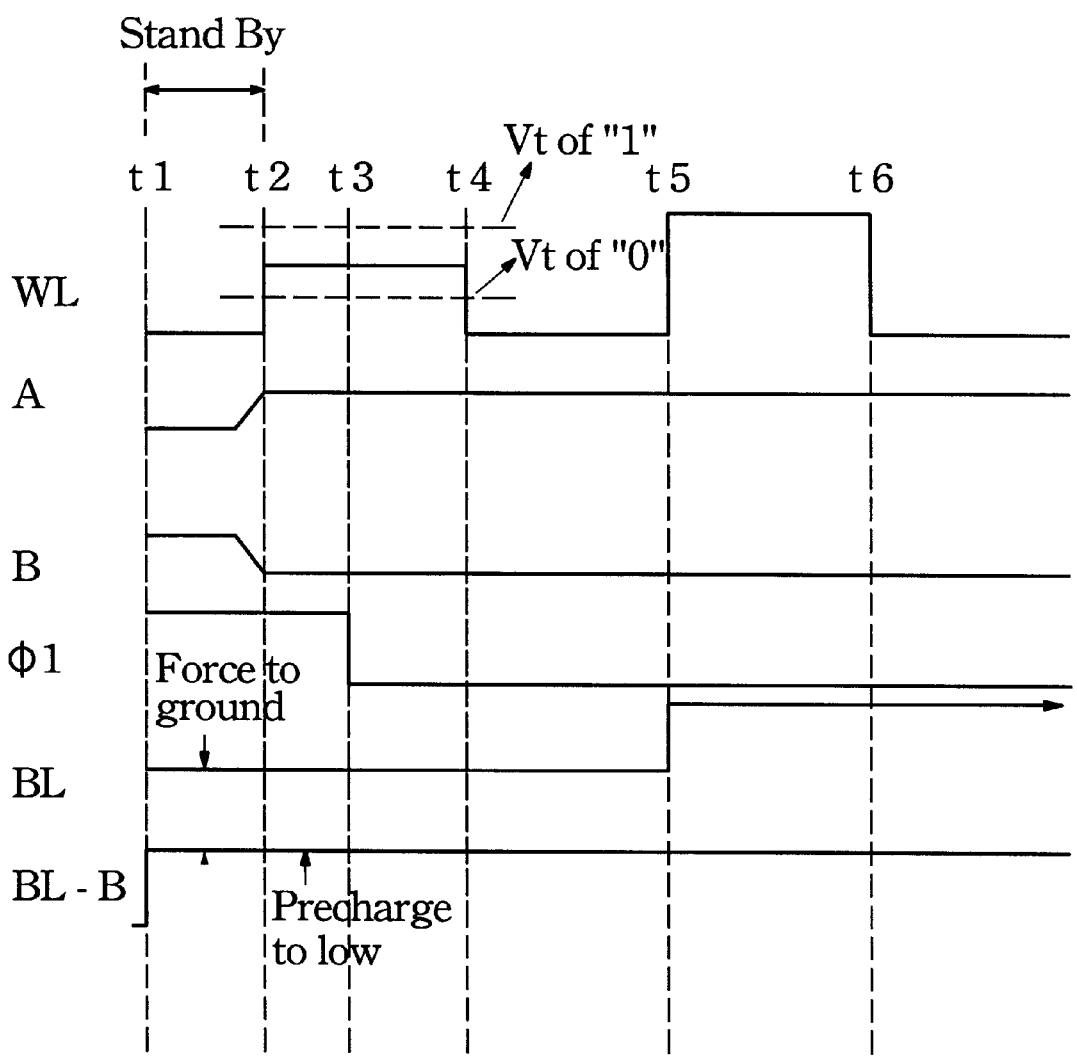
FIG. 4 illustrates a function clock of the NVSRAM of the present invention in nonvolatile operation mode while reading data "1"
Figure 5:
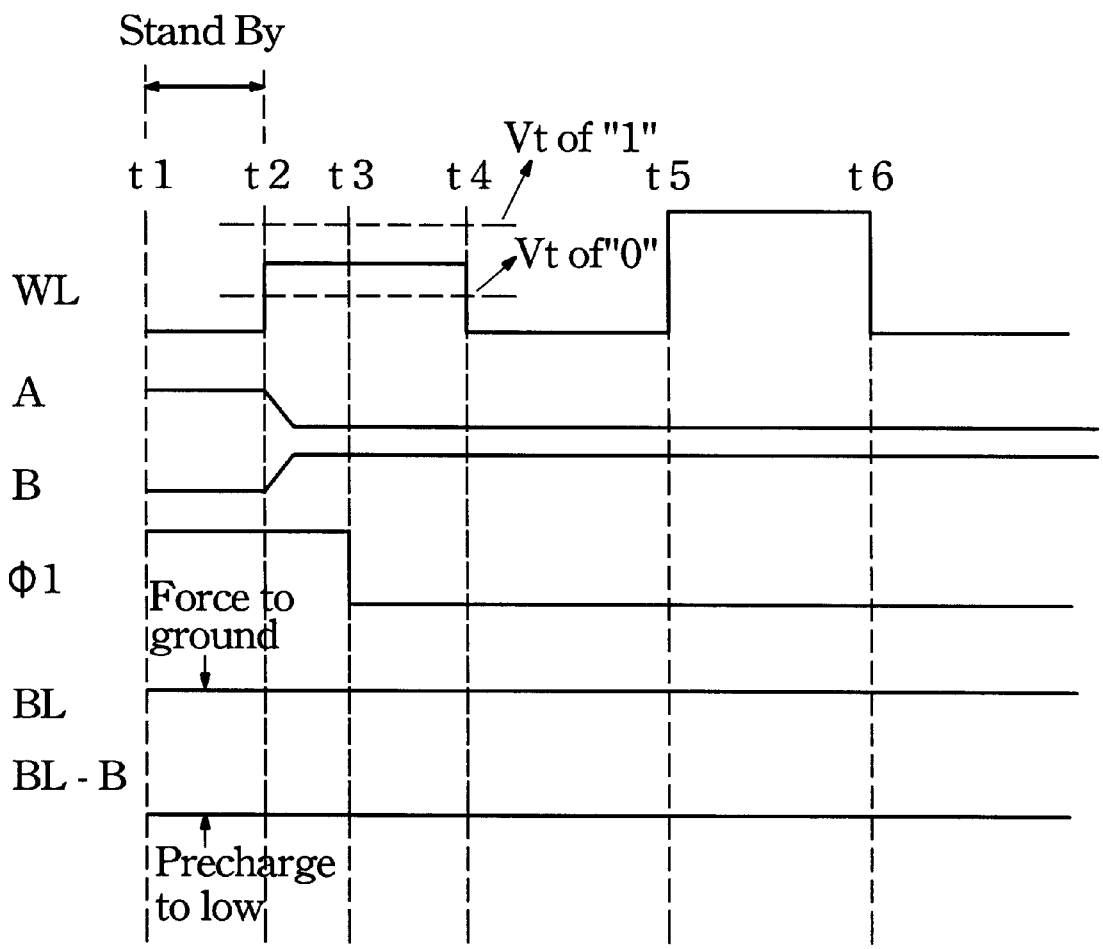
FIG. 5 illustrates a function clock of the NVSRAM of the present invention in nonvolatile operation mode while reading data "0".

When power is turned on, the data stored in the charge storage layer is read out first in the nonvolatile operation mode, and is transmitted to the Data buffer region, and then the data in the Data buffer region is transmitted and written into the NVSRAM cell in the SRAM mode. FIG. 4 and 5 illustrate the reading method of the nonvolatile operation mode.

First, and referring to FIG. 4, a function clock of the NVSRAM of the present invention is illustrated in nonvolatile operation mode while reading data "1". At time tI, NVSRAM is at its stand-by state, the word line WL is low, the second bit line BL-B is precharged to low, and the control line Φ1 is set to high to turn on the transistor T5, so that the first bit line is forced to ground. At time t2, the word line WL is set to a voltage between the threshold voltages Vt of data state "0" and "1". For example, as the threshold voltages of data "0" and "1" are 3.5V and 4.9V respectively, the word line WL is set to a voltage of 4.1 V, the transistor T2 is turned on but the transistor T1 is still closed. Point A is pulled to high, and point B is perturbed by second bit line BL-B and is pulled to low. At time t3, control line Φ1 is shifted to low to close the transistor T5, so that the first bit line BL is not connected to ground. At time t4, the word line WL is closed. At time t5, the word line WL is set to a voltage higher than the threshold voltage of the data state "1", such as 5.0V, so that the transistor T1 is turned on, the first bit line BL is pulled to high, and the second bit line BL-B is still held in low, and hence, the data "1" stored in the NEPM transistor T1 can be read out.

Referring to FIG. 5, a function clock of the NVSRAM of the present invention is illustrated in nonvolatile operation mode while reading data "0". At time t1, NVSRAM is at stand by state, the word line WL is low, the second bit line BL-B is precharged to low, and the control line Φ1 is set to high to turn on the transistor T5, so that the first bit line is forced to ground. At time t2, the word line WL is set to a voltage between the threshold voltages of data state "0" and "1", such as 4.1 V. The transistors T1 and T2 are turned on. Point A is pulled to low, point B is pulled to high, and the second bit line BL-B is pulled to high. At time t3, the control line Φ1 is shifted to low to close the transistor T5, so that the first bit line BL is not connected to ground. At time t4, the word line WL is closed. At time t5, the word line WL is set to a voltage higher than the threshold voltage of the data state "1", such as 5.0V, so the transistors T1 and T2 are turned on again, the first bit line is connected to ground by transistors T1 and T3, the second bit line is held in high, and hence, the data "0" stored in the transistor T1 can be read out.

Consequently, after power is turned on, the data stored in the NEPM transistor T1 is read out in nonvolatile operation mode and is transmitted to the Data buffer region, and then the data in the Data buffer region is transmitted and stored into the NVSRAM cell in SRAM operation mode. Then, the NVSRAM is operated in SRAM mode to access data. The NEPM transistor is accessed data only when power is turned on and turned off, so access times are decreased and the lifetime of the transistor T1 can be protended without an over-cycling operation.

According to the above description, the present invention discloses a NVSRAM and an operation method thereof. One transistor in a conventional SRAM is replaced with a NEPM transistor without increasing additional area of the device. The NVSRAM has both advantages of the SRAM and a nonvolatile memory device. And the NVSRAM has high process integration without an increase in manufacture cost.

While the preferred embodiment of the invention has been illustrated and described, it will be appreciated that various changes can be made therein without departing from the spirit and scope of the invention.

What is claimed is:

1. A nonvolatile static random access memory device adapted for a semiconductor substrate, comprising:

a nonvolatile erasable programmable memory transistor having a charge storage layer for storing data charges, and having a first gate terminal, a first source terminal, and a first drain terminal, wherein the first gate terminal is connected to a word line, the first source terminal is connected to a power supply circuit through a first loader, and the first drain terminal is connected to a first bit line;

an access transistor having a second gate terminal, a second source terminal, and a second drain terminal, wherein the second gate terminal is connected to the word line, the second source terminal is connected to the power supply circuit through a second loader, and the second drain is connected to a second bit line;

a first drive transistor having a third gate terminal, a third source terminal, and a third drain terminal, wherein the third gate terminal is connected to the second source terminal, the third source terminal is connected to ground, and the third drain terminal is connected to the first source terminal;

a second drive transistor having a fourth gate terminal, a fourth source terminal, and a fourth drain terminal, wherein the fourth gate terminal is connected to the first source terminal, the fourth source terminal is connected to ground, and the fourth drain terminal is connected to the second source terminal; and a read control transistor having a fifth gate terminal, a fifth source terminal, and a fifth drain terminal, wherein the fifth gate terminal is connected to a control line, the fifth source terminal is connected to ground, and the fifth drain terminal is connected to the first bit line.

2. The device according to claim 1, wherein the nonvolatile erasable programmable memory transistor comprises a MNOS transistor.

3. The device according to claim 1, wherein the nonvolatile erasable programmable memory transistor comprises a SNOS transistor.

4. The device according to claim 1, wherein the nonvolatile erasable programmable memory transistor comprises a SONOS transistor.

5. The device according to claim 1, wherein the nonvolatile erasable programmable memory transistor comprises a floating gate transistor.

6. The device according to claim 1, wherein a material of the charge storage layer comprises silicon nitride.

7. The device according to claim 1, wherein the first and second loader comprises resistor.

8. The device according to claim 1, wherein the data is stored in the charge storage layer before power is turned off, and the data stored in the charge storage layer is read out after power is turned on.

9. The device according to claim 8, wherein the data stored in the charge storage layer is maintained while power is turned off.

10. A nonvolatile static random access memory adapted for a semiconductor substrate, at least comprising:
   a plurality of nonvolatile static random access memory cell, each nonvolatile static random access memory cell comprising:
      a nonvolatile erasable programmable memory transistor having a charge storage layer for storing data charges, and having a first gate terminal, a first source terminal, and a first drain terminal, wherein the first gate terminal is connected to a word line, the first source terminal is connected to a power supply circuit through a first loader, and the first drain terminal is connected to a first bit line;
      an access transistor having a second gate terminal, a second source terminal, and a second drain terminal, wherein the second gate terminal is connected to the word line, the second source terminal is connected to the power supply circuit through a second loader, and the second drain is connected to a second bit line;
      a first drive transistor having a third gate terminal, a third source terminal, and a third drain terminal, wherein the third gate terminal is connected to the second source terminal, the third source terminal is connected to ground, and the third drain terminal is connected to the first source terminal;
      a second drive transistor having a fourth gate terminal, a fourth source terminal, and a fourth drain terminal, wherein the fourth gate terminal is connected to the first source terminal, the fourth source terminal is connected to ground, and the fourth drain terminal is connected to the second source terminal; and
   a plurality read control transistor, each read control transistor having a fifth gate terminal, a fifth source terminal, and a fifth drain terminal, wherein the fifth gate terminal is connected to a control line, the fifth source terminal is connected to ground, and the fifth drain terminal is connected to the first bit line.

11. The memory according to claim 10, wherein the nonvolatile erasable programmable memory transistor comprises a MNOS transistor.

12. The memory according to claim 10, wherein the nonvolatile erasable programmable memory transistor comprises a SNOS transistor.

13. The memory according to claim 10, wherein the nonvolatile erasable programmable memory transistor comprises a SONOS transistor.

14. The memory according to claim 10, wherein the nonvolatile erasable programmable memory transistor comprises a floating gate transistor.

15. The memory according to claim 10, wherein a material of the charge storage layer comprises silicon nitride.

16. The memory according to claim 12, wherein the first and second loader comprises resistor.

17. The memory according to claim 12, wherein the data is stored in the charge storage layer before power is turned off, and the data stored in the charge storage layer is read out after power is turned on.

18. The memory according to claim 17, wherein the data stored in the charge storage layer is maintained while power is turned off.

19. A method for operating a nonvolatile static random access memory (NVSRAM) adapted for a nonvolatile static random access memory, the memory at least comprising: a nonvolatile erasable programmable memory transistor having a charge storage layer for storing data charges, and having a first gate terminal, a first source terminal, and a first drain terminal, wherein the first gate terminal is connected to a word line, the first source terminal is connected to a power supply circuit through a first loader, and the first drain terminal is connected to a first bit line; an access transistor having a second gate terminal, a second source terminal, and a second drain terminal, wherein the second gate terminal is connected to the word line, the second source terminal is connected to the power supply circuit through a second loader, and the second drain is connected to a second bit line; a first drive transistor having a third gate terminal, a third source terminal, and a third drain terminal, wherein the third gate terminal is connected to the second source terminal, the third source terminal is connected to ground, and the third drain terminal is connected to the first source terminal; a second drive transistor having a fourth gate terminal, a fourth source terminal, and a fourth drain terminal, wherein the fourth gate terminal is connected to the first source terminal, the fourth source terminal is connected to ground, and the fourth drain terminal is connected to the second source terminal; and a read control transistor having a fifth gate terminal, a fifth source terminal, and a fifth drain terminal, wherein the fifth gate terminal is connected to a control line, the fifth source terminal is connected to ground, and the fifth drain terminal is connected to the first bit line, comprising the step of:
   (1) after power is turned on, the data stored in the charge storage layer of the nonvolatile erasable programmable memory transistor is read out in a nonvolatile operation mode and is transmitted to a data buffer region, and then, the data in the data buffer region is transmitted and stored in the NVSRAM cell in a SRAM operation mode;
   (2) after the data is converted, the NVSRAM cell is operated in SRAM operation mode; and
   (3) before power is turned off, the data stored in the NVSRAM cell is read out in SRAM mode and is transmitted to the data buffer region, and then, the data in the data buffer region is stored in the charge storage layer in nonvolatile operation mode.

20. The method according to claim 19, wherein the nonvolatile erasable programmable memory transistor comprises a MNOS transistor.

21. The method according to claim 19, wherein the nonvolatile erasable programmable memory transistor comprises a SNOS transistor.

22. The method according to claim 19, wherein the nonvolatile erasable programmable memory transistor comprises a SONOS transistor.

23. The method according to claim 19, wherein the nonvolatile erasable programmable memory transistor comprises a floating gate transistor.

24. The method according to claim 19, wherein a material of the charge storage layer comprises silicon nitride.

25. The method according to claim 19, wherein the first and second loader comprises resistor.

26. The method according to claim 19, wherein the data stored in the charge storage layer is maintained while power is turned off.

* * * * *